United States Patent
Inagaki

(10) Patent No.: US 11,459,657 B2
(45) Date of Patent: Oct. 4, 2022

(54) GAS SUPPLY UNIT AND GAS SUPPLY METHOD

(71) Applicant: CKD CORPORATION, Komaki (JP)

(72) Inventor: Takeya Inagaki, Komaki (JP)

(73) Assignee: CKD CORPORATION, Komaki (JP)

( * ) Notice: Subject to any disclaimer, the term of this patent is extended or adjusted under 35 U.S.C. 154(b) by 0 days.

(21) Appl. No.: 16/791,003

(22) Filed: Feb. 14, 2020

(65) Prior Publication Data

US 2020/0283899 A1 Sep. 10, 2020

(30) Foreign Application Priority Data

Mar. 6, 2019 (JP) .............................. JP2019-040460

(51) Int. Cl.
| C23C 16/455 | (2006.01) |
| H01L 23/34 | (2006.01) |
| B05D 3/04 | (2006.01) |
| C23C 16/44 | (2006.01) |

(52) U.S. Cl.
CPC .......... *C23C 16/45561* (2013.01); *B05D 3/04* (2013.01); *B05D 3/0426* (2013.01); *C23C 16/4405* (2013.01); *H01L 23/34* (2013.01)

(58) Field of Classification Search
CPC .... B05D 3/04; B05D 3/0426; C23C 16/4405; C23C 16/45561; G01F 15/005; H01L 23/34
See application file for complete search history.

(56) References Cited

U.S. PATENT DOCUMENTS

| 5,595,606 A * | 1/1997 | Fujikawa .......... C23C 16/45572 118/724 |
| 8,753,716 B2 * | 6/2014 | Soininen ........... C23C 16/45561 427/248.1 |
| 9,556,518 B2 * | 1/2017 | Nagase .................. C23C 16/448 |
| 10,767,262 B2 * | 9/2020 | Okura ..................... C23C 16/52 |
| 11,208,722 B2 * | 12/2021 | White .............. C23C 16/45544 |
| 2003/0145789 A1 * | 8/2003 | Bauch .................. C23C 16/448 118/715 |
| 2003/0172872 A1 * | 9/2003 | Thakur ............. C23C 16/45582 118/715 |

(Continued)

FOREIGN PATENT DOCUMENTS

| CN | 106661730 A | 5/2017 |
| JP | 2008-234027 A | 10/2008 |
| JP | 2020-026572 A | 2/2020 |

OTHER PUBLICATIONS

Jul. 13, 2021 Office Action issued in Japanese Patent Application No. 2019-040460.

(Continued)

*Primary Examiner* — Binh X Tran
*Assistant Examiner* — Christopher Remavege
(74) *Attorney, Agent, or Firm* — Oliff PLC

(57) ABSTRACT

A gas supply unit is configured such that when a first gas whose temperature has been controlled at a first temperature is supplied to a chamber through an upper device and then a second gas which starts a chemical reaction at a reaction start temperature lower than the first temperature is supplied to the chamber through the upper device, before cleaning gas is supplied to the chamber through the defined between a base plate and the upper device to cool the upper device down to the reaction start temperature or lower.

6 Claims, 5 Drawing Sheets

(56) References Cited

U.S. PATENT DOCUMENTS

| | | | |
|---|---|---|---|
| 2004/0154746 A1* | 8/2004 | Park | C23C 16/4412 |
| | | | 118/715 |
| 2004/0261850 A1* | 12/2004 | Maula | F16K 49/002 |
| | | | 137/334 |
| 2008/0223455 A1 | 9/2008 | Fukuhara et al. | |
| 2012/0228129 A1* | 9/2012 | Ito | H01J 37/3244 |
| | | | 118/723 E |
| 2013/0104992 A1* | 5/2013 | Yednak, III | F16K 27/003 |
| | | | 137/334 |
| 2013/0160709 A1* | 6/2013 | White | C23C 16/45561 |
| | | | 118/715 |
| 2015/0206736 A1* | 7/2015 | Akae | C23C 16/507 |
| | | | 438/786 |
| 2017/0183773 A1 | 6/2017 | Okura | |
| 2018/0094351 A1* | 4/2018 | Verghese | C23C 16/4481 |
| 2019/0106787 A1* | 4/2019 | Ohno | C23C 16/45561 |
| 2020/0056724 A1* | 2/2020 | Kimoto | H01L 21/67109 |
| 2021/0003340 A1* | 1/2021 | Srivastava | H01L 21/67253 |

OTHER PUBLICATIONS

Dec. 17, 2021 Office Action issued in Chinese Patent Application No. 202010445771.0.

\* cited by examiner

GAS SUPPLY UNIT AND GAS SUPPLY METHOD

CROSS-REFERENCE TO RELATED APPLICATIONS

This application is based upon and claims the benefit of priority from the prior Japanese Patent Applications No. 2019-040460 filed on Mar. 6, 2019, the entire contents of which are incorporated herein by reference.

BACKGROUND

Technical Field

The present disclosure relates to a gas supply unit and a gas supply method.

Related Art

A conventional semiconductor manufacturing process using a semiconductor manufacturing apparatus includes many steps for forming thin films, such as silicon dioxide films and silicon nitride films, on wafers. The thin films are made for example using a chemical vapor deposition (CVD) device. This CVD device is operated to supply, onto the wafers, a single type or several types of process gases, each gas being composed of elements of a thin film material. To make a desired thin film on a wafer surface, a gas supply unit for supplying gas is installed in the CVD device (see for example Japanese unexamined patent application publication No. 2008-234027).

Some types of process gases are liquefied at normal temperatures. To keep the process gas in a vapor state, the gas supply unit is configured to heat a fluid device(s) in which the process gas flows to a temperature equal or close to the temperature of the process gas by use of a heater.

In a thin-film forming process using a process gas, generally, deposited films or by-products are accumulated not only on wafer surfaces but also on inner surfaces of a chamber (a reaction vessel) and inner surfaces of pipes connected to the chamber. Those deposited substances cause deterioration of the quality of thin films and generation of particles in the chamber. For this reason, a cleaning operation is usually performed in which a cleaning gas is supplied to the gas supply unit and the chamber at appropriate timing to cause the deposited substances accumulated on the inner surface of the chamber and the inner surfaces of the pipes to chemically react with the cleaning gas to remove the deposited substances.

SUMMARY

Technical Problems

However, the foregoing conventional art has the following problems. Specifically, unless the temperature of the cleaning gas decreases to a lower temperature than a process gas, some types of cleaning gases may react deposited substances before flowing into the chamber, thereby causing corrosion of the inner surfaces of the pipes or growth of the deposited films on the inner surfaces of the pipes. In the conventional gas supply unit, when using such types of cleaning gases, the fluid device is naturally cooled down to a reaction start temperature of the cleaning gas or lower. This causes a delay in starting a cleaning operation until completion of the natural cooling. Thus, there is scope for improvement in shortening the process time of the semiconductor manufacturing apparatus.

The present disclosure has been made to address the above problems and has a purpose to provide a gas supply unit and a gas supply method, capable of shortening a cooling time, leading to reduction in the process time of a semiconductor manufacturing apparatus.

Means of Solving the Problems

To achieve the above purpose, one aspect of the present disclosure provides a gas supply unit configured to supply a first gas whose temperature has been controlled at a first temperature or a second gas that starts a chemical reaction at a reaction start temperature lower than the first temperature to a chamber, the first gas and the second gas being selectively supplied to the gas supply unit, the gas supply unit comprising: a base plate; an upper device supported above the base plate, the upper device having a passage through which the first gas and the second gas are selectively caused to flow; a plurality of middle blocks placed between the base plate and the upper device, the middle blocks each including a passage connected to the passage of the upper device and defining a space part between the base plate and the upper device; a first heater configured to heat the upper device at the first temperature; and a cooling member configured to supply cooling air to the space part to cool the upper device down to the reaction start temperature or lower.

In the gas supply unit configured as above, after the upper device is heated by the first heater and the first gas is supplied to the chamber, when the second gas is to be supplied to the chamber to clean up the gas supply unit, the chamber, and pipes, the cooling air is supplied to the space part before supply of the second gas. The cooling air supplied to the space part makes heat exchange with the upper device heated by the first heater, thereby cooling the upper device. Thus, the gas supply unit in the above aspect can shorten the time required to cool the upper device as compared with a conventional case in which an upper device is naturally cooled, and hence shorten the process time of a semiconductor manufacturing apparatus.

According to the gas supply unit of the present disclosure, a gas supply unit and a gas supply method can be provided capable of shortening a cooling time and hence shortening a process time of a semiconductor manufacturing apparatus.

DETAILED DESCRIPTION OF THE EXEMPLARY EMBODIMENTS

Figure 1:
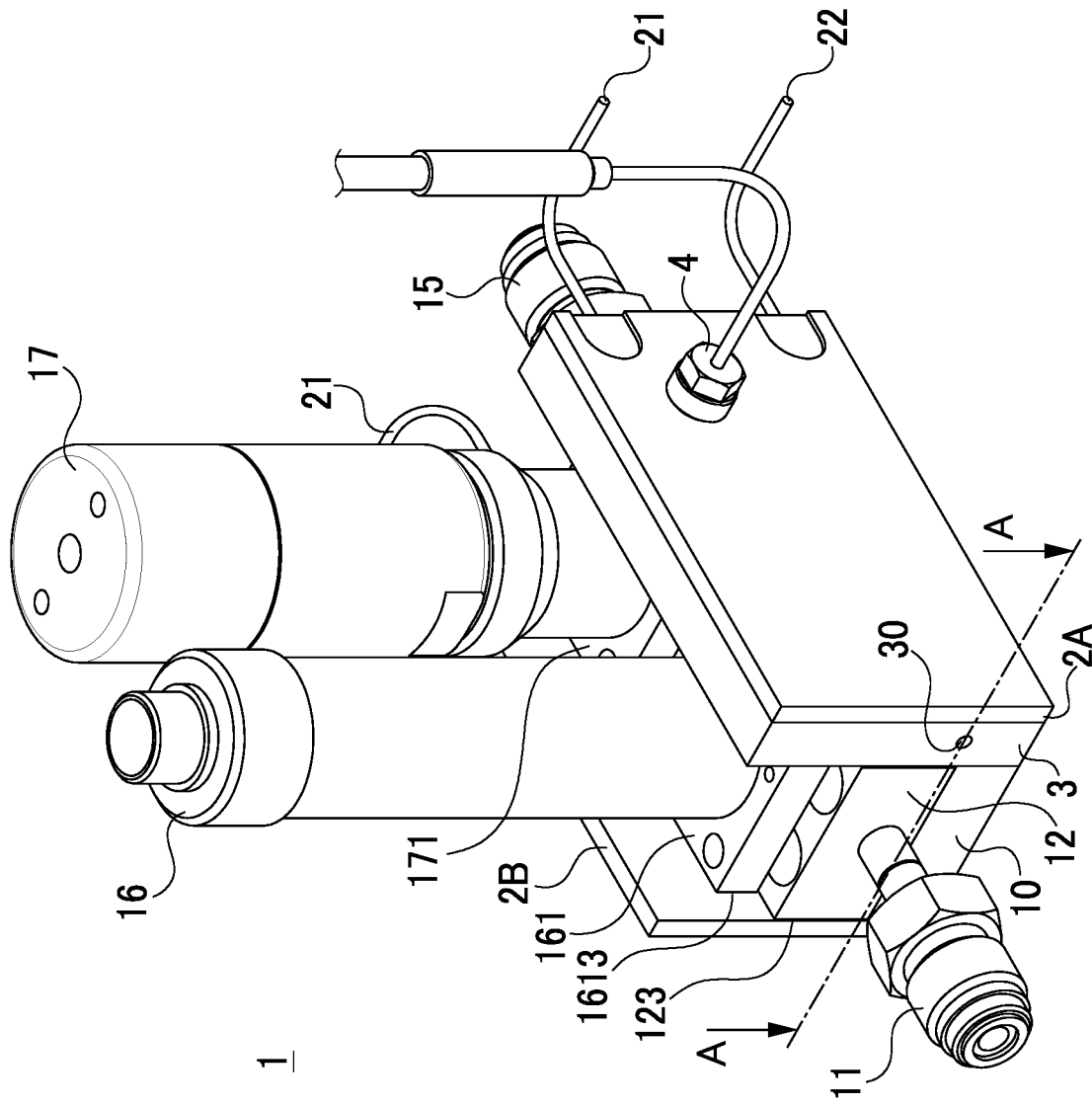
FIG. 1 is an external perspective view of a gas supply unit in an embodiment of the present disclosure.
Figure 2:
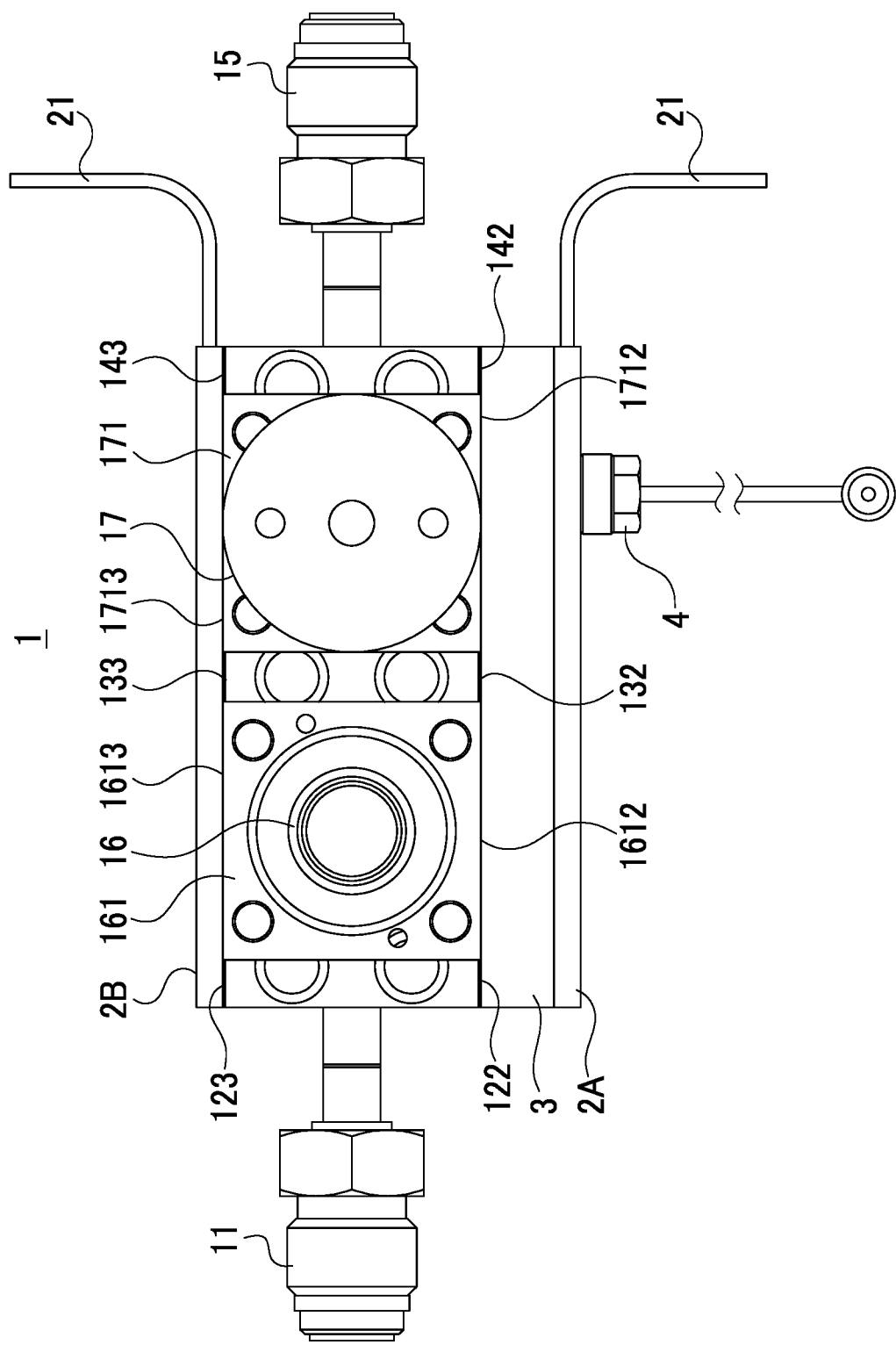
FIG. 2 is a top view of the gas supply unit.
Figure 3:
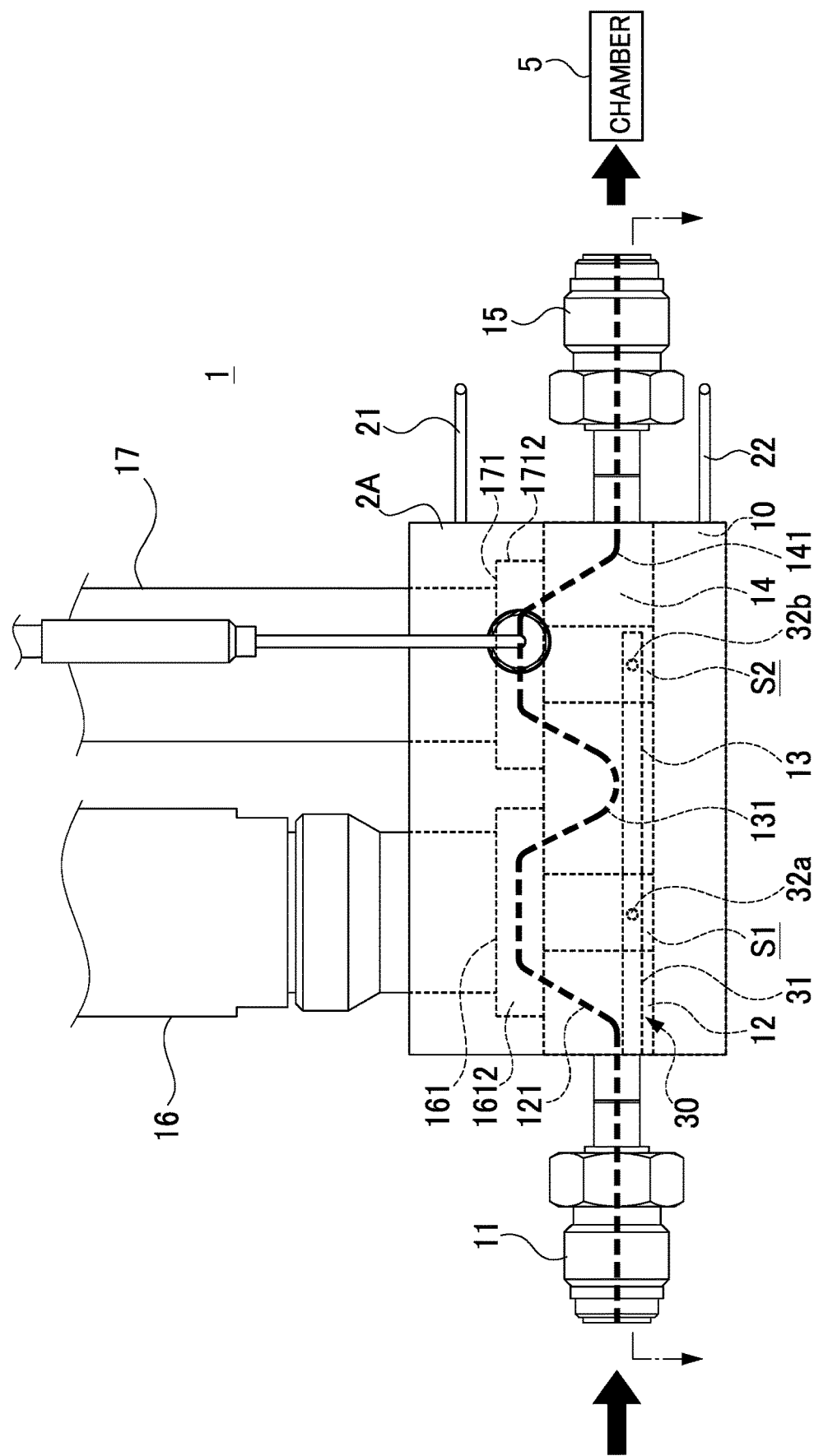
FIG. 3 is a side view of the gas supply unit.
Figure 4:
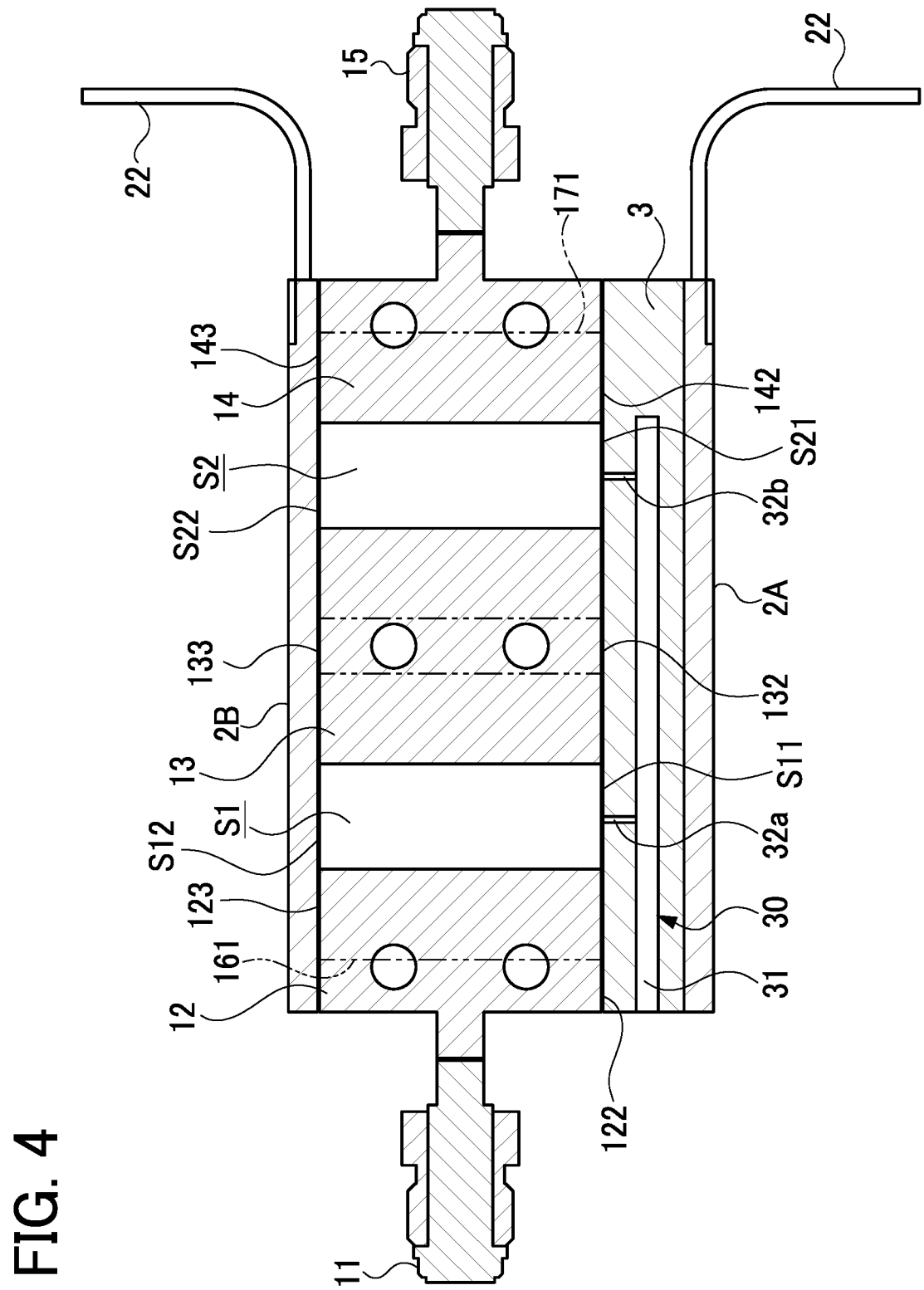
FIG. 4 is a cross-sectional view taken along a line A-A in FIG. 1.
Figure 5:
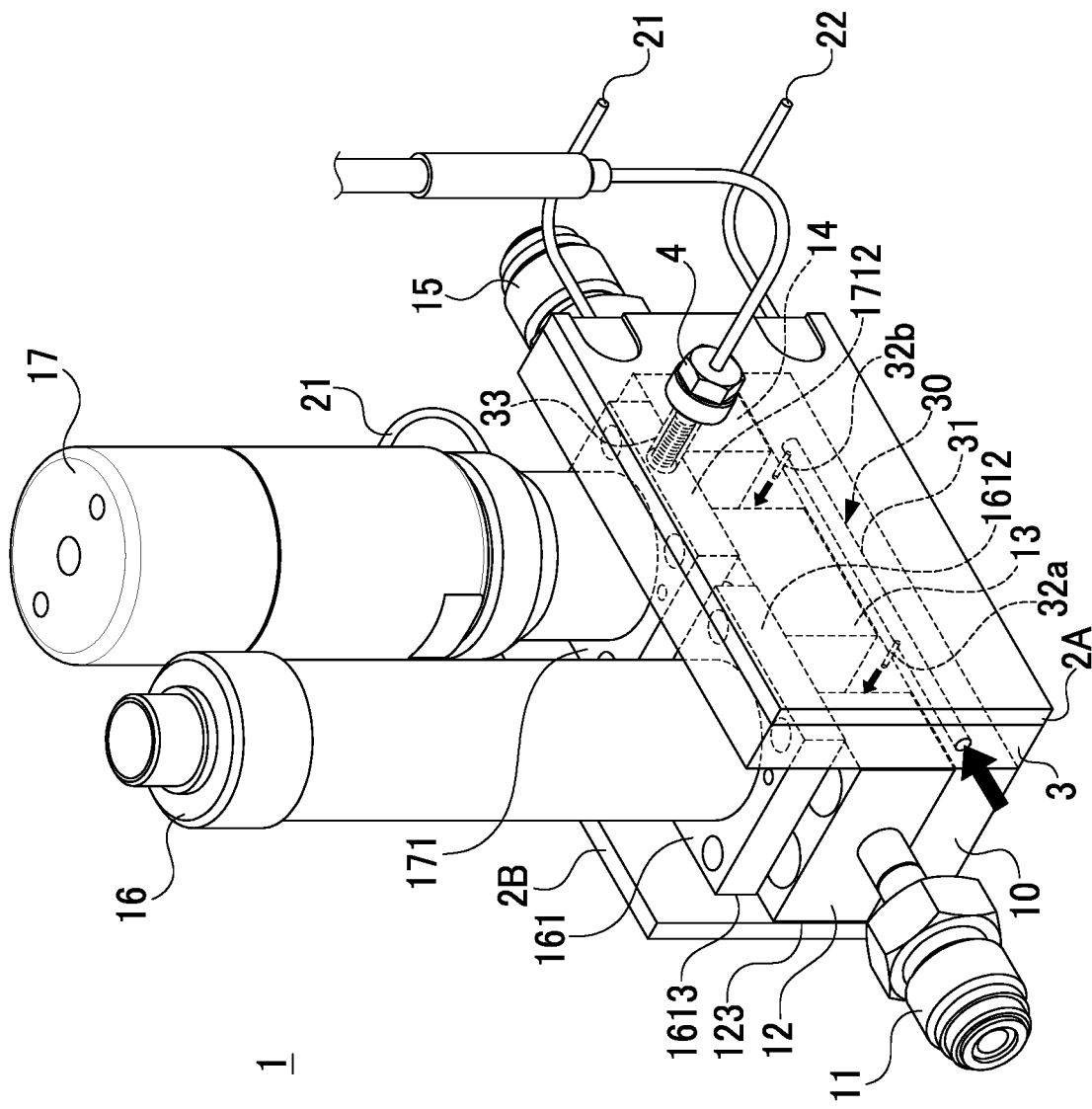
FIG. 5 is a block diagram showing a flow of cooling air.

A detailed description of an embodiment of a gas supply unit according to the present disclosure will now be given referring to the accompanying drawings. FIG. 1 is an external perspective view of a gas supply unit 1 in the present embodiment. FIG. 2 is a top view of the gas supply unit 1. FIG. 3 is a side view of the gas supply unit 1. FIG. 4 is a cross-sectional view taken along a line A-A in FIG. 1. FIG. 5 is a block diagram showing a flow of cooling air. In the following description, the direction along the thickness of a base plate 10 corresponds to a vertical direction in the drawings.

The gas supply unit 1 shown in FIGS. 1 and 2 mainly includes a pressure sensor 16 and a valve 17 which are integrally coupled in series to each other along a flow direction of gas passing through the gas supply unit 1 (i.e., in a left-and-right direction in FIG. 2). This gas supply unit 1 is used for example for a CVD device for forming thin films on semiconductors in a semiconductor manufacturing apparatus. In the semiconductor manufacturing apparatus, there are provided with a common line connected to for example a chamber (a reaction vessel) 5 of the CVD device and first to third branch lines, that is, a first gas supply line for supplying a process gas to the common line, a second gas supply line for supplying a purge gas to the common line, and a third gas supply line for supplying a cleaning gas to the common line. The gas supply unit 1 is placed on the common line. At a connection point of the first to third gas supply lines to the common line, there is provided a changeover valve not shown. The gas supply unit 1 is configured to be switched by the changeover valve to selectively connect to one of the first to third gas supply lines to regulate a flow of gas to be supplied to the chamber 5. The process gas is one example of a first gas and the cleaning gas is one example of a second gas.

As shown in FIG. 3, specifically, the gas supply unit 1 includes a base plate 10, a first middle block 12, a second middle block 13, a third middle block 14, the pressure sensor 16, and the valve 17 to regulate a flow of gas to be supplied to the chamber 5. The pressure sensor 16 and the valve 17 are each provided with a passage through which the first gas and the second gas are selectively caused to pass. The pressure sensor 16 and the valve 17 are one example of an upper device, which is supported above the base plate 10 through the first to third middle blocks 12 to 14. The pressure sensor 16 and the valve 17 in the present embodiment respectively include a device block 161 and a device block 171 for connecting to the middle blocks 12-14. The gas supply unit 1 is further provided with a first heater 2A, a second heater 2B, and a cooling plate member 3, which are used to heat or cool the gas supply unit 1 according to a process for forming thin films. The cooling plate member 3 is one example of a cooling member. The types and the number of the foregoing devices, and the number of middle blocks are not limited to those cited in the present embodiment.

The first middle block 12, the second middle block 13, the third middle block 14, the device block 161, and the device block 171 are each made of metal with good heat conductivity, such as stainless steel, and formed in a rectangular parallelepiped shape. Those first middle block 12, second middle block 13, and third middle block 14 are spaced at predetermined intervals and fixed by screws on the top surface of the base plate 10.

The pressure sensor 16 is configured to detect the pressure of a gas to be supplied to the chamber 5 and fixed by screws on the top surfaces of the first middle block 12 and the second middle block 13. The valve 17 is configured to control supply/shutoff of a flow of a fluid to the chamber 5. This valve 17 is fixed by screws on the top surfaces of the second middle block 13 and the fourth middle block 14. The first middle block 12 and the second 13 define a space part S1 and the second middle block 13 and the third middle block 14 define a space part S2 between the base plate 10 and the pressure sensor 16 or the valve 17.

The first middle block 12 is integrally connected to a first joint 11 placed on a left-side surface of the first middle block 12 in the figure. The first middle block 12 is formed with a passage 121 connecting the first joint 11 to the passage of the pressure sensor 16. The second middle block 13 is formed with a V-shaped passage 131 connecting the passage of the pressure sensor 16 to the passage of the valve 17. The third middle block 14 is connected to a second joint 15 placed on a right-side surface of the third middle block 14 in the figure. The third middle block 14 is formed with a passage 141 connecting the passage of the valve 17 to the second joint 15.

The process gas in the present embodiment is a gas containing materials for forming thin films, for example, a gas which is liquefied at room temperatures, such as titanium chloride ($TiCl_4$). In the gas supply unit 1, for the purpose of keeping the process gas in a vapor state, the first heater 2A and the second heater 2B are placed on opposite sides of the pressure sensor 16 and the valve 17 in which the process gas whose temperature has been controlled at a predetermined temperature, e.g. a first temperature, is caused to flow, that is, on both sides of the passages through which gas flows, as shown in FIG. 2, thereby heating the pressure sensor 16 and the valve 17 to maintain the process gas at the predetermined temperature.

The cleaning gas in the present embodiment is a gas containing materials which can react with deposited substances attached to passage surfaces of the gas supply unit 1, the inner surface of the chamber 5, the inner peripheral surface of pipes connecting the gas supply unit 1 to the chamber 5, and others, to remove the deposited substance therefrom. This gas will start chemical reaction at a reaction start temperature lower than a set temperature of the process gas. The cleaning gas is for example fluoride gas, such as a chlorine trifluoride ($ClF_3$). In the gas supply unit 1, furthermore, the cooling plate member 3 is placed so as to intervene between the first heater 2A and the pressure sensor 16 and between the first heater 2A and the valve 17. Specifically, one surface of the cooling plate member 3 is in surface contact with the first heater 2A and the other surface is in contact with the pressure sensor 16 and the valve 17. The cooling plate member 3 is one example of a cooling member.

The first heater 2A is a rectangular planar heater, e.g. a plate or sheet heater, and configured to generate heat according to energization amount applied between wires 21 and 22 as shown in FIG. 1. Specifically, as shown in FIGS. 2 and 3, the first heater 2A has the size enough to directly or indirectly make contact with, or cover over, a side surface of the base plate 10, a first side surface 122 of the first middle block 12, a first side surface 132 of the second middle block 13, a first side surface 142 of the third middle block 14, a first side surface 1612 of the device block 161, and a first side surface 1712 of the device block 171. The second heater 2B, which is similar in configuration to the first heater 2A, has the size enough to make contact with a side surface of the base plate 10, a second side surface 123 of the first middle block 12, a second side surface 133 of the second middle block 13, a second side surface 143 of the third middle block 14, a second side surface 1613 of the device block 161, and a second side surface 1713 of the device block 171.

The cooling plate member 3 is made of aluminum that is higher in heat conductivity than stainless steel, and formed in a plate shape having the size similar or equal to the first heater 2A, as shown in FIGS. 4 and 5. The cooling plate member 3 has such a thickness as to allow a cooling passage 30 to be formed therein. The cooling passage 30 includes a main passage 31 and branch passages 32a and 32b. The main passage 31 has a predetermined length and extends in a coupling direction of the pressure sensor 16 and the valve 17, that is, in a direction in which a gas flows through the gas supply unit 1. In the present embodiment, for example, the cooling passage 30 is configured to have an open end, which opens in a side surface (i.e., a left side surface in FIG. 4) of the cooling plate member 3 and is connected to a cooling-air supplier not shown, and a closed end, which is closed at a position corresponding to at least an upper device (the valve 17 in the present embodiment) having a passage connected to the second joint 15. The branch passages 32a and 32b branch off from the main passage 31 to respectively communicate with the space parts S1 and S2.

In the present embodiment, the branch passages 32a and 32b are provided in one-to-one correspondence with the space parts S1 and S2. As an alternative, two or more branch pipes 32a or 32b may be provided to each of the space parts S1 and S2. Furthermore, the main passage 31 and the branch passages 32a and 32b as shown in FIG. 4 are placed on the same level in a horizontal cross-section. As an alternative, the branch passages 32a and 32b may be provided to extend obliquely with respect to the main passage 31.

The cooling plate member 3 includes a through hole 33 extending through the cooling plate member 3 in its thickness direction as shown in FIG. 5. A thermocouple 4 is placed to extend through the first heater 2A and the through hole 33 of the cooling plate member 3 so that a leading end of the thermocouple 4 abuts on the first side surface 1712 of the device block 171. The first to third middle blocks 12 to 14 and the device blocks 161 and 171 are integrally heated by use of the first heater 2A and the second heater 2B. Accordingly, the thermocouple 4 is configured to detect the temperature of the entire gas supply unit 1 through the device block 171.

The gas supply unit 1 is temperature-controlled by a controller not shown connected to the thermocouple 4, the first heater 2A and the second heater 2B. The unillustrated controller may be provided integral with the gas supply unit 1 or provided as a higher-level controller independent from the gas supply unit 1.

Next, gas supply operations of the gas supply unit 1 will be described. Herein, titanium chloride is used as the process gas, chlorine trifluoride is used as the cleaning gas, and nitrogen gas is used as a purge gas.

When the CVD device is used to carry out a thin-film forming process, the gas supply unit 1 is operated to heat the first to third middle blocks 12 to 14 and the device blocks 16 and 17 by use of the first heater 2A and the second heater 2B. The first heater 2A is placed on one side surface of the gas supply unit 1 through the cooling plate member 3, as described above. Since this cooling plate member 3 is made of a material with high conductivity, the cooling plate member 3 increases in temperature integrally with the first heater 2A. Accordingly, the gas supply unit 1 is heated by the first heater 2A and the second heater 2B as in the case of a gas supply unit including no cooling plate member. The gas supply unit 1 is configured to hold the valve 17 in a closed state until the thermocouple 4 detects that the temperature of the gas supply unit 1 has increased to a value equal or close to the set temperature of the process gas, during which the process gas is not supplied to the chamber 5 (Pre-heating step). In the present embodiment, the set temperature of the process gas is 150° C.

The gas supply unit 1 is configured to open the valve 17 when the thermocouple 4 detects that the temperature of the gas supply unit 1 is equal or close to the set temperature of the process gas. When the valve 17 is opened, the process gas is supplied to the chamber 5 through the gas supply unit 1. During this period, the temperature of the gas supply unit 1 is kept equal or close to the set temperature of the process gas by the first heater 2A and the second heater 2B. When a predetermined quantity of process gas is supplied to the chamber 5, the valve 17 in the gas supply unit 1 is closed (Process gas supply step). This process gas supply step is one example of a first-gas supply step.

Upon completion of the thin-film forming process in the chamber 5, the gas to be supplied to the gas supply unit 1 is switched from process gas to purge gas on an upstream side of the gas supply unit 1. While the gas supply unit 1 remains heated by the first heater 2A and the second heater 2B, the valve 17 is opened, allowing the purge gas to flow into the chamber 5 (Purge gas supply step).

In the chamber 5, the thin-film forming process is carried out while switching a gas to be supplied between process gas and purge gas in the above manner.

In a cleaning step for cleaning the pipes of the gas supply unit 1 and the chamber 5, while the valve 17 is held in a closed state, the first heater 2A and the second heater 2B are de-energized and thus the gas supply unit 1 is no longer heated. In the gas supply unit 1, subsequently, room-temperature cooling air is supplied through the cooling plate member 3 to the space parts S1 and S2 (Cooling step).

Specifically, the cooling air is supplied at a predetermined flow rate to the space parts S1 and S2 through the main passage 31 and the branch passages 32a and 32b. Each of those space parts S1 and S2 includes a first opening S11 or S21 through which cooling air is supplied from the cooling plate member 3 and a second opening S12 or S22 located opposite the first opening S11 or S21. Those second openings S12 and S22 are closed by the second heater 2B, so that the cooling air can spread over each of the space parts S1 and S2. Furthermore, the branch passages 32a and 32b open in the space parts S1 and S2 at or below lower-end positions of the passages 121, 131, and 141. This arrangement causes heat convection in the space parts S1 and S2, thereby enabling to efficiently cool the first to third middle blocks 12 to 14, the pressure sensor 16, and the valve 17.

The second heater 2B is placed in contact, but not in hermetical or tight contact, with the base plate 10, the first to third middle blocks 12 to 14, the pressure sensor 16, and the valve 17 so that a gap is left between the second heater 2B and those components. Thus, the air in the space parts S1 and S2 is forced by cooling air to flow into the gap and then out to atmosphere. In other words, the cooling air is caused to flow through the space parts S1 and S2 as streams directed from the first heater 2A side to the second heater 2B side, thereby accelerating heat exchange with the first to third middle blocks 12 to 14, the pressure sensor 16, and the valve 17, which have been heated by the first heater 2A and the second heater 2B. In this manner, the gas supply unit 1 in which the cooling air flows through the space parts S1 and S2 can be rapidly decreased in temperature before supply of the cleaning gas to the chamber 5.

When the thermocouple 4 detects that the temperature of the gas supply unit 1 has decreased to a value equal to or lower than the reaction start temperature of the cleaning gas, for example, 80° C. or lower, the gas supply unit 1 is supplied with the cleaning gas from an upstream side thereof. At that time, the valve 17 is opened and thus the gas supply unit 1 operates to supply the cleaning gas to the chamber 5 for a predetermined period of time. After a lapse of the predetermined period of time, the valve 17 is closed and thus the gas supply unit 1 stops supply of the cleaning gas (Cleaning gas supply step). This cleaning gas supply step is one example of a second-gas supply step. In this step, the cleaning gas flowing through the gas supply unit 1, the pipes, and the chamber 5 removes the deposited substances therefrom.

Specifically, the cleaning gas flows through the gas supply unit whose temperature has been decreased to the reaction start temperature or lower. Thus, while being kept at the reaction start temperature or lower, the cleaning gas flows from the gas supply unit 1 into the chamber 5. This cleaning gas removes the deposited substances attached to the gas supply unit 1, the inner surface of the chamber 5, the inner surfaces of the pipes connecting the gas supply unit 1 to the chamber 5, and others, without chemically reacting the deposited substances.

In a subsequent thin-film forming process, the gas supply unit 1 similarly performs the foregoing pre-heating step, the process gas supply step, and the purge gas supply step in order. The cooling step and the cleaning step may be performed after completion of each thin-film forming process or may be conducted at regular intervals, such as once a day or once a week.

(1) The gas supply unit 1 in the present embodiment, described above, is configured to supply the process gas whose temperature has been controlled at the first temperature and the cleaning gas which starts a chemical reaction at a reaction start temperature lower than the first temperature to the chamber, the first gas and the second gas being selectively supplied to the gas supply unit 1. This gas supply unit 1 includes the base plate 10, the pressure sensor 16 and the valve 17 each having a passage through which the process gas and the cleaning gas are selectively caused to flow, the first to third middle blocks 12 to 14 each placed between the base plate 10 and the pressure sensor 16 or the valve 17, each middle block including a passage connected to the passages of the pressure sensor 16 and the valve 17 and defining the space parts S1 and S2 between the base plate 10 and the pressure sensor 16 or the valve 17, the first heater 2A configured to heat the pressure sensor 16 and the valve 17 up to the first temperature, and the cooling plate member 3 configured to supply the cooling air to the space parts S1 and S2 to cool the pressure sensor 16 and the valve 17 down to the reaction start temperature or lower.

In the thus configured gas supply unit 1 in the present embodiment, after the pressure sensor 16 and the valve 17 are heated by the first heater 2A and then the process gas is supplied to the chamber 5, when the cleaning gas is to be supplied to the chamber 5 to clean up the gas supply unit 1, the pipes, and the chamber 5, the cooling air is supplied to the space parts S1 and S2 prior to supply of the cleaning gas. The cooling air supplied to the space parts S1 and S2 exchanges heat with the pressure sensor 16 and the valve 17 heated by the first heater 2A, thereby cooling the pressure sensor 16 and the valve 17. According to the gas supply unit 1 of the present embodiment, therefore, the pressure sensor 16 and the valve 17 can be cooled more quickly than when they are naturally cooled. This can shorten the process time of the semiconductor manufacturing apparatus.

When titanium chloride is used as the process gas and chlorine trifluoride is used as the cleaning gas as mentioned above, the boiling point of the titanium chloride being as high as 136.4° C., the gas supply unit 1 is heated to 150° C. by use of the first heater 2A and the second heater 2B during the thin-film forming process. In a subsequent cleaning step, if the temperatures of the pressure sensor 16 and the valve 17 remain at 150° C., the cleaning gas, i.e., chlorine trifluoride, may be heated by flowing through the pressure sensor 16 and the valve 17 and thus chemically react with the deposited substances attached to the passage surfaces of the gas supply unit 1, the inner surfaces of the pipes connecting the gas supply unit 1 to the chamber 5 and others before flowing into the chamber 5 or chemically react with the deposited substances attached to the inner surface of the chamber 5 after flowing into the chamber 5. Such a chemical reaction may accelerate corrosion or growth of deposited films. To prevent such defects, the pressure sensor 16 and the valve 17 need to be cooled to 80° C. or less before chlorine trifluoride is supplied thereto.

In the case of natural cooling, it took about 2 hours to cool the pressure sensor 16 and the valve 17 from 150° C. to 80° C. or less. In contrast, in the present embodiment adopting forced cooling using the cooling air supplied into the space parts S1 and S2, it took only about 15 minutes to forcibly cool the pressure sensor 16 and the valve 17 to 80° C. or less. The gas supply unit 1 in the present embodiment can greatly shorten the time required to cool the pressure sensor 16 and the valve 17 as compared with the case of naturally cooling the pressure sensor 16 and the valve 17, and thus can contribute to shortening the process time of the semiconductor manufacturing apparatus.

(2) In the gas supply unit described in (1), the pressure sensor 16 and the valve 17 are made of stainless steel, the first heater 2A is a planar heater, the cooling plate member 3 is made of aluminum and interposed between the first heater 2A and a set of upper devices (i.e., the pressure sensor 16 and the valve 17), so that the surfaces of the cooling plate member 3 correspondingly contact with the first heater 2A and the pressure sensor 16 and the valve 17.

In the gas supply unit 1 configured as above in the present embodiment, the cooling plate member 3 made of aluminum with higher heat conductivity than stainless steel is in contact with the pressure sensor 16, the valve 17, and the first heater 2A. When the first heater 2A is energized, generating heat, the temperature of the cooling plate member 3 quickly rises to a temperature equal or close to the temperature of the first heater 2A, thereby heating the pressure sensor 16 and the valve 17 in cooperation with the first heater 2A. On the other hand, when the first heater 2A is de-energized, generating no heat, and then the cooling air is supplied to the space parts S1 and S2, the cooling plate member 3 is quickly cooled by the cooling air, thereby cooling the pressure sensor 16 and the valve 17. According to the gas supply unit 1 in the present embodiment, therefore, even though the cooling plate member 3 is interposed between the first heater 2A and the set of the pressure sensor 16 and the valve 17, the pressure sensor 16 and the valve 17 can be efficiently heated and cooled.

(3) In the gas supply unit 1 described in (2), the cooling plate member 3 includes the cooling passage 30 for supplying cooling air to the space parts S1 and S2, the cooling passage 30 extending in the direction in which the process gas is caused to flow through the gas supply unit 1.

In the gas supply unit 1 configured as above in the present embodiment, the cooling air flows in the direction in which the process gas is caused to flow through the gas supply unit 1, that is, in the direction of arrangement of the pressure sensor 16 and the valve 17. This configuration can uniformly cool the pressure sensor 16 and the valve 17, leading to shortening of the cooling time.

(4) In the gas supply unit 1 described in one of (1) to (3), the planar second heater 2B is further provided in contact with the pressure sensor 16 and the valve 17, the second opening S12 or S22 of each of the space parts S1 and S2, located opposite the first openings S11 and S21 through which cooling air is supplied to the corresponding space parts S1 and S2 from the cooling plate member 3, is closed by the second heater 2B, which is a planar heater, placed in contact with the pressure sensor 16 and the valve 17.

The gas supply unit 1 in the present embodiment is configured to spread the cooling air all over the space parts S1 and S2, which can uniformly cool the pressure sensor 16, the valve 17, and the first to third middle blocks 12 to 14, leading to shortening of the cooling time.

The foregoing embodiments are mere examples and give no limitation to the present disclosure. The present disclosure may be embodied in other specific forms without departing from the essential characteristics thereof.

In the foregoing embodiment, for instance, the cooling air is supplied to the space parts S1 and S2 from the cooling plate member 3 interposed between the first heater 2A and the pressure sensor 16 and between the first heater 2A and the valve 17. As an alternative, a nozzle configured to spray out cooling air into the space parts S1 and S2 may be attached as the cooling member to the first heater 2A. However, the cooling member constituting of the cooling plate member 3 as in the foregoing embodiment can cool a wider area of the pressure sensor 16 and the valve 17, leading to shortening of the cooling time. Furthermore, since the cooling plate member 3 internally includes the cooling passage 30, this can eliminate the space part for a pipe(s) connected to the nozzle to flow cooling air and thus achieve compact configuration of the gas supply unit 1.

(2) For instance, the cooling plate member 3 may be made of stainless steel instead of aluminum in the foregoing embodiment. However, the cooling plate member 3 made of aluminum is more preferable because such an aluminum plate can shorten the temperature increasing time and the cooling time, leading to shortening of the process time of the semiconductor device.

(3) For instance, in the foregoing embodiment, the both-end openings (i.e., the first openings S11 and S21 and the second openings S12 and S22) of each space part S1 and S2 are closed respectively by the cooling plate member 3 and the second heater 2B. As an alternative, the openings (the second openings S12 and S22) opposite the cooling plate member 3 may not be closed by the second heater 2B, that is, the second heater 2B may be omitted. However, the configuration that the second openings S12 and S22 are closed to define the space parts S1 and S2 as separate cavities under the pressure sensor 16 and the valve 17 enables the cooling air to spread over the lower surfaces of the pressure sensor 16 and the valve 17, thereby efficiently cooling the pressure sensor 16 and the valve 17. This can shorten the cooling time.

(4) In the foregoing embodiment, for example, the gas supply unit 1 is connected to the chamber 5 of the CVD device and used to supply process gas and process gas to the chamber 5. As an alternative, the gas supply unit 1 may be connected to a chamber in a different process and used to supply another type of process gas.

(5) For example, the purge gas supply step may be dispensed with. That is, the gas supply unit 1 may be configured to perform only supply of process gas.

(6) The upper devices of the gas supply unit 1 may be different from e.g. a combination of a flow sensor and a proportional valve or a combination of a flow control valve and an on-off valve. The gas supply unit 1 may include a single upper device or three or more upper devices. Furthermore, the number of middle blocks may be appropriately changed according to the number of upper devices and the passage configuration. For instance, an upper device may be made up of a fluid device and a manifold block on which the fluid device is attached, and a plurality of middle blocks may be placed between the manifold block and the base plate located below the manifold block.

(7) The gas supply unit 1 may be provided with a changeover valve for switching a supply gas between process gas and purge gas and configured to control more than one type of gas to be selectively supplied to the chamber.

REFERENCE SIGNS LIST

1 Gas supply unit
2A First heater
2B Second heater
3 Cooling plate member
5 Chamber
10 Base plate
12 First middle block
13 Second middle block
14 Third middle block
30 Cooling passage

What is claimed is:

1. A gas supply unit configured to supply a first gas whose temperature has been controlled at a first temperature or a second gas that starts a chemical reaction at a reaction start temperature lower than the first temperature to a chamber, the first gas and the second gas being selectively supplied to the gas supply unit, the gas supply unit comprising:
a base plate;
an upper device supported above the base plate, the upper device having a passage through which the first gas and the second gas are selectively caused to flow;
a plurality of middle blocks placed between the base plate and the upper device and spaced from each other, the middle blocks each including a passage connected to the passage of the upper device and defining a space part between the base plate and the upper device so that the space part is formed between the middle blocks that are spaced from each other;
a first heater configured to heat the upper device at the first temperature; and
a cooling member configured to supply cooling air to the space part to cool the upper device and the middle blocks down to the reaction start temperature or lower.

2. The gas supply unit according to claim 1, wherein the first heater is a planar heater, and the cooling member is a cooling plate member made of aluminum and placed between the first heater and the upper device so that the cooling member is in surface contact with each of the first heater and the upper device.

3. The gas supply unit according to claim 2, wherein the cooling plate member includes a cooling passage through which the cooling air is supplied to the space part, the cooling passage being formed to extend in a direction in which the first gas flows through the gas supply unit.

4. The gas supply unit according to claim 1 further comprising a second heater, which is a planar heater, placed in contact with the upper device,
wherein the space part is defined to have a first opening in which the cooling air is supplied from the cooling member and a second opening located opposite the first opening and closed by the second heater.

5. The gas supply unit according to claim 2 further comprising a second heater, which is a planar heater, placed in contact with the upper device,
wherein the space part is defined to have a first opening in which the cooling air is supplied from the cooling member and a second opening located opposite the first opening and closed by the second heater.

6. The gas supply unit according to claim 3 further comprising a second heater, which is a planar heater, placed in contact with the upper device,
wherein the space part is defined to have a first opening in which the cooling air is supplied from the cooling member and a second opening located opposite the first opening and closed by the second heater.

* * * * *